(12) United States Patent
Abedifard et al.

(10) Patent No.: US 8,547,734 B1
(45) Date of Patent: Oct. 1, 2013

(54) METHOD OF READING FROM AND WRITING TO MAGNETIC RANDOM ACCESS MEMORY (MRAM)

(71) Applicant: Avalanche Technology, Inc., Fremont, CA (US)

(72) Inventors: Ebrahim Abedifard, Sunnyvale, CA (US); Siamack Nemazie, Los Altos Hills, CA (US); Parviz Keshtbod, Los Altos Hills, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 13/752,192

(22) Filed: Jan. 28, 2013

Related U.S. Application Data

(63) Continuation of application No. 13/429,293, filed on Mar. 23, 2012, now Pat. No. 8,385,108.

(51) Int. Cl.
*G11C 11/00* (2006.01)

(52) U.S. Cl.
USPC ........................ 365/158; 365/173; 365/189.16

(58) Field of Classification Search
USPC .......... 365/158, 173, 189.16, 189.15, 189.07, 365/171, 203, 175, 189.19
See application file for complete search history.

(56) References Cited

U.S. PATENT DOCUMENTS

2006/0039183 A1* 2/2006 Lin et al. ................. 365/158
2008/0175041 A1* 7/2008 Aoki ....................... 365/158

* cited by examiner

*Primary Examiner* — Dang Nguyen
(74) *Attorney, Agent, or Firm* — Maryam Imam; IPxLAW Group LLP

(57) ABSTRACT

A method of writing to a magnetic memory cell that includes selecting a magnetic memory cell having a pair of MTJs, and based on whether the selected magnetic memory cell is an 'odd' magnetic memory cell or an 'even' magnetic memory cell and a state to which the selected magnetic memory cell is being written, setting a distinct bit line (BL), coupled to a first MTJ of the pair of MTJs or a second MTJ of the pair of MTJs, to a voltage level indicative of a certain state that causes current to flow through the pair of MTJs in a manner that causes the direction of current flow through one of the first or second MTJs to be in a direction opposite to that of the other one of the first or second MTJs to program the first and second MTJs in opposite states.

5 Claims, 3 Drawing Sheets

METHOD OF READING FROM AND WRITING TO MAGNETIC RANDOM ACCESS MEMORY (MRAM)

CROSS REFERENCE TO RELATED APPLICATIONS

The application is a continuation of pending U.S. patent application Ser. No. 13/429,293, filed on Mar. 23, 2012, by Ebrahim Abedifard, et al., and entitled, "DIFFERENTIAL MAGNETIC RANDOM ACCESS MEMORY (MRAM)".

BACKGROUND OF THE INVENTION

1. Field of the Invention

The invention relates generally to a magnetic random access memory (MRAM) array and particularly to a method and apparatus for writing and reading of magnetic MRAM cells of the magnetic MRAM array.

2. Description of Prior Art

Magnetic random access memory (MRAM) enjoys popularity and wide range of applications among which are replacement of volatile and non-volatile memory. However, reading from and writing to MRAM, particularly those based on spin torque transfer (STT) technology presents challenges that hinder the practical application of MRAM. Namely reading of memory cells that are made of magnetic memory is currently not very reliable. A key contributor has to do with the manner in which a MRAM cell is read. In reading the MRAM cells, reference MRAM cells are employed. Each MRAM cell that is to be accessed for reading is compared to a reference MRAM cell with the result of the comparison determining the state of the MRAM cell, during a read operation. Comparison is done either by comparing the voltage differential across a reference cell and a cell that is to be read or by comparing the resistance of a cell to be read to the resistance of reference cells. The resistance of the reference cell, needs to be between the resistances of cells in the logical states of '1' and '0'. These distributions are shown in the graph of FIG. 1.

FIG. 1 shows a graph of the resistance distribution of a typical MTJ for the cases where the MTJ takes on a logical state of '1' and '0'. The distributions of the MTJ resistances are Gaussian distributions. The variances of these distributions depend on MTJ processing and grow larger as the size of the memory increases. For very large memories, the two distributions could overlap. In the case of overlap, several reference cells are required. For example one could use one or more reference cells per column rather than one or more reference cells per chip (or "semiconductor device"). The more a reference cell is used, the smaller the variance of distribution of the cells that are grouped together to use the same reference. The resistance of the reference cell in these cases would be the average resistance of the MTJ in the state of 1 and 0, or Rref=(Rh+Rl)/2 where "Rref" represents the resistance of the reference cell, "Rh" represents the resistance of a cell to be accessed when the cell is in a high or "1" logical state and "Rl" represents the resistance of a cell to be accessed when the cell is in a low or "0" logical state. When a cell with Rh or Rl is compared to this reference cell, the signal generated is equal to:

$$V=I*(Rh-(Rh+Rl)/2)=I*((Rh+Rl)/2-Rl) \quad \text{Eq. (1)}$$

$$\text{Which is } V=I*(Rh-Rl)/2 \quad \text{Eq. (2)}$$

In another word, reference cells are manufactured to have predetermined resistances with approximately half of the sum of Rl and Rh. An example of this is if Rh is set to 2 kilo ohms and Rl is set to 1 kilo ohm, the reference resistance would be set to approximately 1.5 kilo ohms such that a MRAM element with a resistance measurement above 1.5 kilo ohms is declared to be at a 'high' state and a resistance measurement of less than 1.5 kilo ohms, is declared to be at a 'low' state. The differential of Rl and Rh is oftentimes lower than the level required to detect this differential, particularly due to manufacturing limitations, such as process variation. This leads to unreliability during read operations, because the differential voltage is below the detection threshold of the sense amplifier.

As memory arrays become larger, the foregoing problem is further exaggerated because the resistance of a MRAM element is a function of the area thereof. This leads to unreliability when reading of the MRAM element of a MRAM cell.

That is, in current design methods, sensing is carried out by comparing the resistance of the MRAM element that is accessed to a reference MRAM element. In an effort to obtain a differential in the voltage between the MRAM element to be read and the reference MRAM element, different current values for the reference MRAM element is employed versus the current value of the MRAM element to be read or the reference MRAM element is manufactured to have a resistance value equal to (Rh+Rlow)/2. Both of these techniques impose problems one of which in comparing Rh (or "Rlow") with (Rh+Rlow)/2, which problematically reduces the sensing signal by half and another problem is the variations of the MRAM elements' resistances with respect to the resistance of the reference MRAM element. The variation in the size of the MRAM element is the largest contributor of the variation of the resistance of the MRAM element.

To overcome the foregoing problems, some prior art techniques use more than one reference MRAM element for the entire memory array, such as one or more per column of MRAM elements. However, these techniques still suffer from the statistical variation of the resistance of the MRAM element. Another technique utilizes 2 MRAM elements per cell and programming of the cell in these techniques requires programming one MRAM element to the desired state and the other MRAM to the opposite state. One benefit of the foregoing is that the signal that is generated is: V=I*(Rh-Rl) with "V" representing voltage and "I" representing current and "V" being twice as large as the reference. Another benefit is that the statistical variation is reduced. The drawback of these techniques is that the memory cell size is increased.

What is needed is a reliable method and apparatus for reading MRAM cells of a memory array by avoiding relying on reference cell yet requiring decreased programming current or voltage and area.

SUMMARY OF THE INVENTION

To overcome the limitations in the prior art described above, and to overcome other limitations that will become apparent upon reading and understanding the present specification, the invention discloses a method and a corresponding structure for a magnetic storage memory device that is based on current-induced-magnetization-switching having reduced read errors.

Briefly, a method of writing to a magnetic memory cell is disclosed to include selecting a magnetic memory cell having a pair of MTJs, and based on whether the selected magnetic memory cell is an 'odd' magnetic memory cell or an 'even' magnetic memory cell and a state to which the selected magnetic memory cell is being written, setting a distinct bit line (BL), coupled to a first MTJ of the pair of MTJs or a second MTJ of the pair of MTJs, to a voltage level indicative of a certain state that causes current to flow through the pair of MTJs in a manner that causes the direction of current flow through one of the first or second MTJs to be in a direction opposite to that of the other one of the first or second MTJs to program the first and second MTJs in opposite states.

These and other objects and advantages of the present invention will no doubt become apparent to those skilled in the art after having read the following detailed description of the preferred embodiments illustrated in the several figures of the drawing.

IN THE DRAWINGS

DETAILED DESCRIPTION OF THE VARIOUS EMBODIMENT

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the invention.

Figure 1:
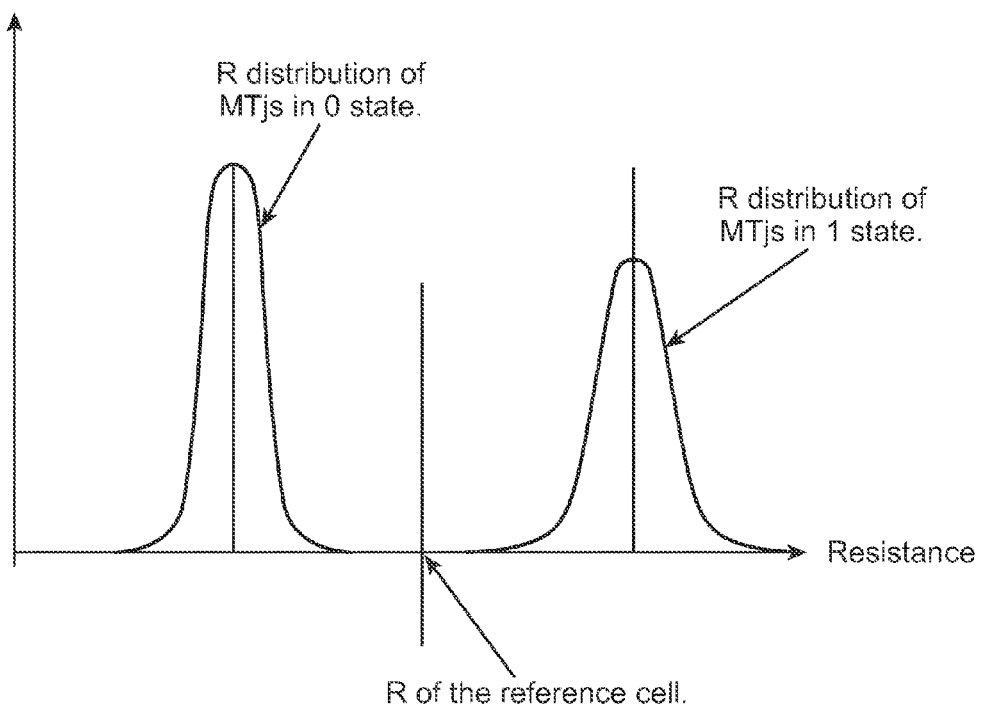
FIG. 1 shows a graph of the resistance distribution of a typical MTJ for the cases where the MTJ takes on a logical state of '1' and '0'.
Figure 2:
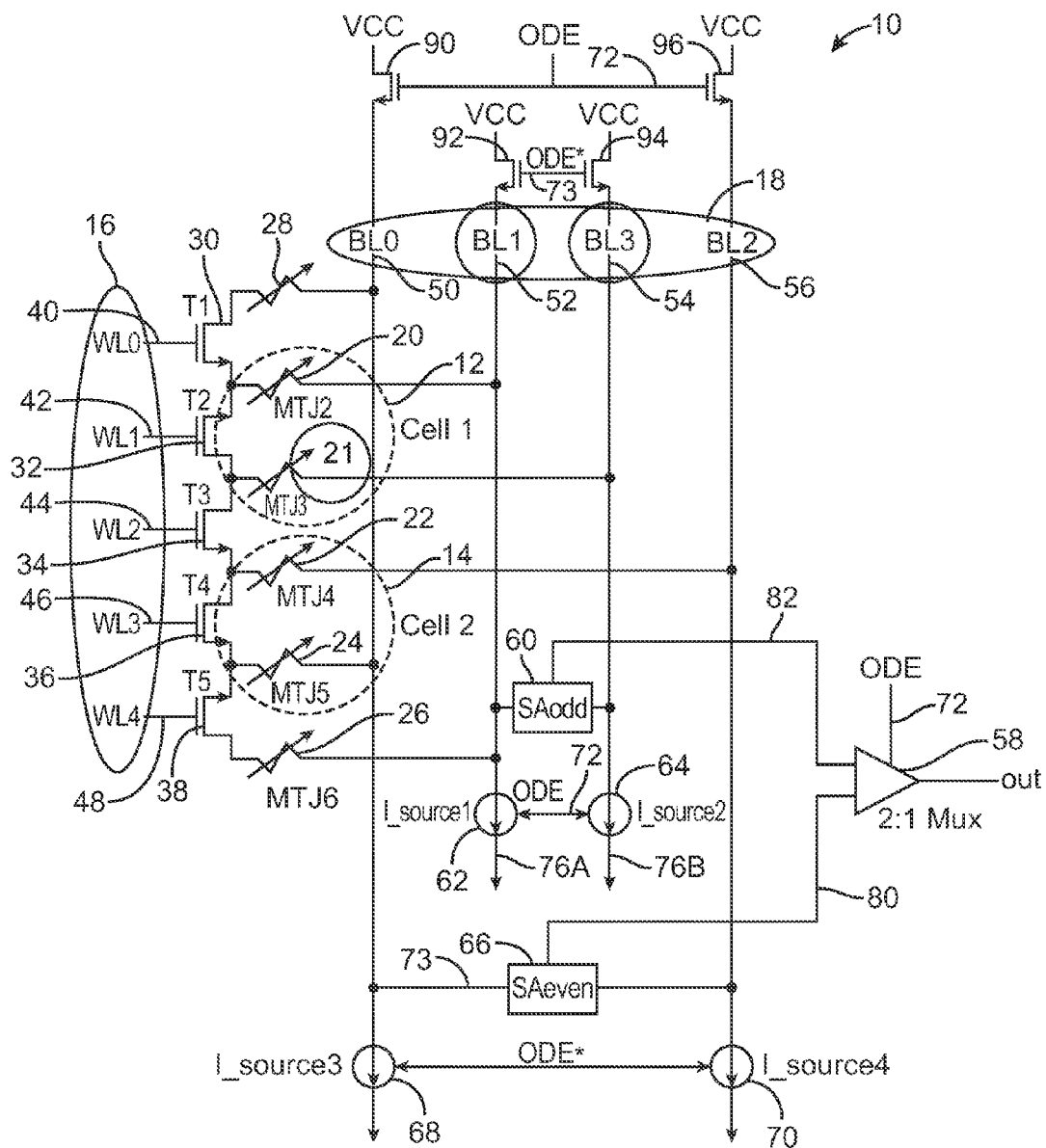
FIG. 2 shows a magnetic random access memory (MRAM) array 10, in accordance with an embodiment of the invention.

Referring now to FIG. 2, a magnetic random access memory (MRAM) array 10 is shown to include at least two MRAM cells 12 and 14, word lines 16, bit lines 18, an odd-cell sense amplifier 60 (also referred to as "odd sense amplifier"), an even-cell sense amplifier 66 (also referred to as "even sense amplifier"), current sources 62, 64, 68, and 70, and a multiplexer 58. Each of the cells 12 and 14 includes a pair of MRAM elements and an access transistor. For example, the cell 12, which is also referred to herein as "cell 1", includes the MRAM elements 20 and MRAM element 21 (the elements 20 and 21 collectively comprise a "pair" of MRAM elements) and the access transistor 32 coupled to the word line, WL1 42, and the cell 14, which is referred to herein as "cell 2", includes the MRAM elements 22 and 24 (the elements 22 and 24 collectively comprise a "pair" of MRAM elements).

Each MRAM cell, in addition to a pair of MRAM elements, is also shown to include an access transistor. The access transistor 36 is shown coupled to word line WL3 46. Adjacent cells are shown coupled through a read access transistor connecting the source of the access transistor of a cell to the drain of the access transistor of an adjacent cell. The read access transistor is coupled to a read word line.

In FIG. 2, the read access transistor 34 is shown to couple cell 1 and cell 2 and is shown coupled to the read word line, WL2 44. Cells in a column are alternatively connected to a pair of even and odd bit lines. In FIG. 2 cell 1 is connected to the pair of odd bit lines BL1 52 and BL3 54 and cell 2 is connected to the pair of even bit lines BL0 50 and BL2 56. The array 10 comprises numerous MRAM cells organized in row and columns of which merely a few number is shown in FIG. 2 for the sake of simplicity.

At the top and bottom of array a dummy half cell comprising of a dummy read access transistor and dummy MRAM element couples the adjacent cell to a bit line, the dummy read access transistor is coupled to a dummy read word line. In FIG. 2 at the top a dummy half cell comprising a dummy read access transistor 30, and a dummy MRAM element 28 couple cell to BL0 50 and the dummy read access transistor 30 is coupled to dummy read word line WL0 40. In FIG. 2 at the bottom a dummy half cell comprising a dummy read access transistor 38, and a dummy MRAM element 26 couple cell 2 to BL1 52 and the dummy read access transistor 38 is coupled to dummy read word line WL4 48.

Additional MRAM elements and access transistors are shown in FIG. 2, such as MRAM elements 26 and 26 and access transistors 30 and 38, to indicate that the array 10 comprises numerous MRAM cells of which merely a few number of which is shown in FIG. 2 for the sake of simplicity. The word lines 16 is shown to include a number of word lines, of which WL0-WL 4, or WL 40-WL 48, respectively, are shown. Similarly, bit lines 18 is shown to include a number of bit lines, of which BL0-BL 3, or BL 50-BL 56, respectively, are shown. BL1 is shown immediately adjacent to BL0 and BL3 and BL3 are shown immediately adjacent to BL1 and BL2 and so forth. Similarly, WL1 is shown immediately adjacent to WL0 and WL2 and WL2 is shown immediately adjacent to WL1 and WL3 and so on.

It is noted that MRAM elements are also referred to herein as magnetic tunnel junctions (MTJs). For example, MRAM element 20 is referred to herein as "MTJ" 20 and MRAM element 22 is referred to as "MTJ" 22. It is further noted however, that a MRAM element is typically made of an MTJ in addition to other structures or layers.

Being that each MRAM cell is made of a pair of MRAM elements rather than a single MRAM element, which is generally the case in prior art structures, the size of the array 10 is increased as each MRAM element pair acts as a single prior art MRAM element, however, as will be evident shortly, the reliability of reading to a MRAM cell of FIG. 2 is greatly enhanced and the current for programming the pair is reduced relative to prior art structures.

Referring still to FIG. 2, the access transistor 32 of cell 1 is shown to be coupled to the WL1 42 at its gate and to the MTJ 20 at its drain and at the node of this connection, it is also shown coupled to the source of the dummy read access transistor 30. The MTJ 20, at an end opposite to that of the end where it is coupled to the transistor 32 is shown coupled to the BL1 52. The access transistor 32, at its source is shown coupled to one end of the MTJ 21 with an opposite end of the MTJ 21 shown coupled to the BL 3 54. The access transistor 36 of the cell 2 is shown coupled at its gate to the WL 3 46 and to the MTJ 22 at its drain and at the node of this connection, there is also shown coupled to the source of the read access transistor 34. The MTJ 22 is shown coupled to the drain of access transistor 36 at one end and to BL 2 56 at the other end. The source of the access transistor 36 is shown coupled to an end of the MTJ 24 and is shown coupled to the drain of the dummy read access transistor 38. The MTJ 24 is shown coupled to the BL0 50 at one end and to the source of access transistor 36 at the other end. The read access transistor 34, at its gate, is shown coupled to the WL2 44 and its source is shown coupled to the drain of access transistor 36 and at its drain coupled to source of access transistor 32 thus coupling cell 1 to cell 2. The dummy read access transistor 30, at its gate, is shown coupled to the WL0 40 and its source is shown coupled to the drain of access transistor 32 and at its drain coupled to MTJ 28, and the MTJ 28 shown coupled to BL0 50 at the other end. The dummy read access transistor 38, at its gate, is shown coupled to the WL4 48 and its drain is shown coupled to the source of access transistor 36 and at its source coupled to MTJ 26, and the MTJ 26 shown coupled to BL1 52 at the other end.

The even bit line BL0 50 is also shown coupled to the even-cell sense amplifier 66, a bit line driver transistor 90 and the current source 68. The even bit line BL2 56 is also shown coupled to the even sense amplifier 66, a bit line driver transistor 96 and the current source 70. The current source 68 is shown coupled to BL0 50 at one end and to ground at another end and is further shown to receive the signal ODE* 73. The current source 70 is coupled to BL2 56 at one end and to ground at another end and is further shown to receive the signal ODE* 73. The source of bit line driver transistor 90 is shown coupled to "Vcc" and its drain is shown coupled to BL0 50 and its gate is shown to receive the signal ODE 72. The source of the bit line driver transistor 96 is shown coupled to "Vcc", the drain thereof is shown coupled to the BL 2 56 and the gate thereof is shown coupled to receive the signal ODE 72. When the signal ODE* 73 is "low" the current sources 68 and 70 are enabled and when the signal ODE 72 is "high" the bit line driver transistors 90 and 96 are "OFF". The signals ODE 72 and ODE* 73 are operative during read operation, The amplifier 66 is shown to be responsive to the BL0 50 at one end and BL2 56 at an opposite end, and shown to generate the output 80, coupled onto one of the inputs of the multiplexer 58.

The odd bit line BL1 52 is also shown coupled to the odd-cell sense amplifier 60, a bit line driver transistor 92 and the current source 62. The odd bit line BL3 54 is also shown coupled to the odd-cell sense amplifier 60, a bit line driver transistor 94 and the current source 64. The current source 62 is coupled to BL1 52 at one end and to ground at another end and is further shown to receive the signal ODE 72. The current source 64 is coupled to BL3 54 at one end and to ground at another end and is further shown to receive the signal ODE 72. The source of bit line driver transistor 92 is coupled to "Vcc", the drain coupled to BL1 52 and the gate receives signal ODE* 73. The source of bit line driver transistor 94 is coupled to "Vcc", the drain coupled to BL3 54 and the gate receives signal ODE* 73. When the signal ODE 72 is "low" the current sources 62 and 64 are enabled. When the signal ODE* 73 is "high" the bit line driver transistors 92 and 94 are "OFF". When the signal ODE* 73 is "low" the bit line driver transistors 92 and 94 are "ON". The signals ODE 72 and ODE* 73 are operative during read operation, The amplifier 60 is shown to be responsive to the BL1 52 at one end and BL3 54 at an opposite end, and shown to generate the output 82, coupled onto one of the inputs of the multiplexer 58.

The signal ODE 72 denotes "odd/even" and in this respect, depending on its polarity, indicates whether an even or an odd cell is being accessed.

The multiplexer 58 is shown to also receive an output 80, generated by the amplifier 66, and to receive the ODE signal 72 for selecting between the outputs 80 and 82 as the data that is read from the array 10. When ODE 72 is "high" output 80 of even sense amplifier 66 is selected and when ODE 72 is "low" output 82 of odd sense amplifier 60 is selected.

Each of the MTJs of the array 10 acts as a variable resistor, which is the reason each is shown as such. As previously stated, two MTJs are included in each MRAM cell. This is done because during programming (or writing) to a cell, one of the MTJs of the cell is programmed to a 'high' state and the other MTJ is programmed to a 'low' state. Then, the voltages across through these two MTJs are compared to each other, based on the difference between their resistances, and depending on which one of the two MTJs is 'high', the data is declared to be '1' (or 'high) or '0' (or 'low'). Further details of the programming of a MRAM cell of the array 10 is shown and discussed shortly.

Writing to a cell is now described. During a write (or "programming") operation, to program an odd cell such as cell 1, WL1 42 is set high while all remaining WLs are set low, thus selecting cell 1. To program the state '1' into the cell 12, BL1 52 is set high while all other BLs are grounded. Accordingly, current flows from the BL1 52, through the MTJ 20, access transistor 32, and the MTJ 21, and programs the MTJs 20 from an anti-parallel (AP) state to a parallel (P) state, while the MTJ 21 is programmed from a P to an AP state. This results in the resistance of the MTJ 20 being low while the resistance of the MTJ 21 is high. If a state of '0' is being programmed into the cell 1, the BL 3 54 is set high while all other BLs are grounded. This reverses the direction of the current and the resistance of the MTJ 20 is then high while the resistance of the MTJ 21 is low.

To program an even cell such as cell 2, WL 3 46 is set high while all remaining WLs are set low, thus selecting cell 2. To program the state '1' into the cell 2, BL3 56 is set high while all other BLs are grounded. Accordingly, current flows from the BL 3 56, through the MTJ 22 and the MTJ 24, and programs the MTJs 22 from an anti-parallel (AP) state to a parallel (P) state, while the MTJ 24 is programmed from a P to an AP state. This results in the resistance of the MTJ 22 being low while the resistance of the MTJ 24 is high. If a state of '0' is being programmed into the cell 2, the BL 0 50 is set high while all other BLs are grounded. This reverses the direction of the current and the resistance of the MTJ 22 is then high while the resistance of the MTJ 24 is low. Other even and odd cells are programmed similarly.

The programming current required for programming the MTJ pair is the higher switching current of the two switching currents of the MTJs (the higher of switching current for switching P to AP state or switching AP to P state) whereas prior art programming current for programming the pair is the sum of the switching current required to switch P to AP state and the switching current required to switch AP to a P state.

Additionally, by sharing the source and the drain of the adjacent transistors the area of MRAM cell of the various embodiments of the invention is reduced compared to that of prior art cells having two MTJs per cell because in the latter, a separation is required between adjacent transistors.

Figure 3:
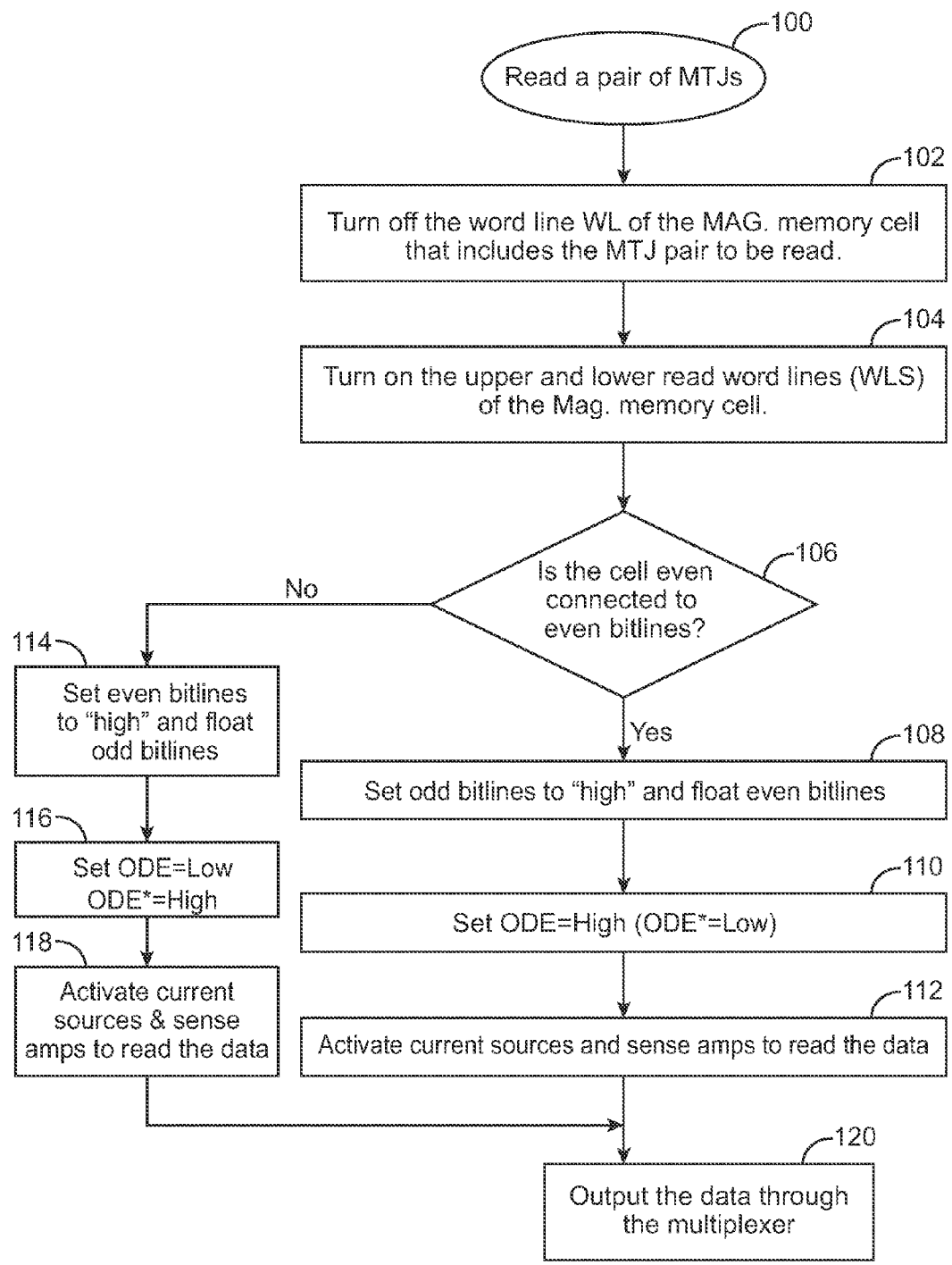
FIG. 3 shows a flow chart of the steps performed in reading a magnetic memory cell, in accordance with a method of the invention.

FIG. 3 shows a flow chart of the relevant steps employed in reading a MRAM cell, in accordance with a method of the invention. In FIG. 3, a MRAM cell is presumed to include a pair of MTJs and is read with the read process starting accordingly at 100. At step 102, the word lines that are coupled to the access transistor of MRAM cell to be read are turned off. By way of example, with reference to FIG. 2, assuming the cell 12 is being read, the WL 1 42 is turned off or set to 'low' (or "deactivated"). It is noted that while, 'low' is used to represent 'off' or '0' and 'high' is used to represent 'on' or '1' herein, an opposite polarity may be employed per design choice. An example of a voltage level representing a 'high' state is 1.2 Volts and ground represents 'low' or 0 volts.

Next, at step 104, the read word line (or dummy read word line) that is located immediately above the word line of the cell to be read and the read word line (or dummy read word line) that is located immediately below the word line of the cell to be read are turned 'on', and all remaining WLs, such as but not limited to the WLs 46 and 48 are turned 'off' (at zero volts). In FIG. 2, the read word lines (or dummy read word line) that are immediately above and below the WL 1 42 are WL 0 40 and WL 2 44, respectively. Next, at 106, it is determined whether the cell that is to be read is an odd or even cell (connected to odd or even bit lines) and if it is even, the process continues to step 108 and if it is odd, the process continues to step 114. At step 108, with reference to FIG. 2, odd bit lines, BL1 52 and BL3 54 are set to 'high' or Vcc (or "activated") and the even bit lines BL 0 50 and BL 2 56 are allowed to float. Alternatively, the BL 0 50 and BL 2 56 can be both be set to logical state '1' or '0', preferably driven low, but in any case the voltage of both is substantially equal. Next, at step 110, the ODE signal 72 is set 'high' or set to indicate that the cell being accessed is even. All remaining BLs, other than the BLs 52 and 54, are also allowed to float.

If an odd cell is being read, during the determination at 106, the process continues to step, 114. At step 114, with reference to FIG. 2, even bit lines, BL 0 50 and BL 2 56 are set to 'high' or Vcc (or "activated") and the odd bit lines BL 1 52 and BL 3 54 are allowed to float. In FIG. 3, after step 114, at step 116, the ODE signal 72 is set low indicating an odd cell. Next, at step 118, the current sources 62 and 64 and sense amplifiers 60 are activated to read the data.

In FIG. 3, after the steps 112 and 118, the process continues to step 120 where the data that is sensed (or "read") is coupled through the multiplexer 58 and it is selected by the multiplexer 58 based on the cell being read. That is, if the cell is an odd cell, the process continues, in FIG. 3, from the step 118 to the step 120 with the multiplexer 58 selecting to couple the data from the output of the sense amplifier 60, i.e. output 82, as the read data, and if the cell is an even cell, the data from the output of the sense amplifier 66, i.e. output 80, is coupled onto the multiplexer 58 output as the read data. An "even" cell refers to a cell is coupled to even bit lines and an "odd" cell refers to a cell coupled to odd bit lines. Reference to a "pair of MTJs" herein is the same as "differential MTJs".

By way of example if an odd cell, cell 1 is being accessed and since the two MTJs of the cell 12 are programmed to be of opposite states, (for example, in FIG. 2, the MTJ 20 is programmed to be 'high' whereas the MTJ 21 is programmed to be 'low'), then current flows from the BL 0 50, through the MTJ 28, and through the dummy read access transistor 40 and through the MTJ 20, to the BL 1 52 and through the current source 72. Similar thing happens from BL 2 56, current flows through MTJ 22, read access transistor 44, and MTJ 21, through current source 74. Since the resistance values of MTJs 20 and 21 are different the voltages at the odd sense amplifier 60 are different, resulting in sensing 1 or zero depending whether the resistance of MTJ 20 is higher than MTJ 21 or vice versa.

That is, these current sources and sense amplifiers effectively compare the voltages across the MTJs 20 and 21 to each other and depending on which voltage is higher the state of the cell 12 is declared accordingly. In alternative embodiments, currents through the MTJs 20 and 21 are compared to each other but require design change to the embodiment of FIG. 2, as known to those in the art.

Thus, the array 10 of FIG. 2 advantageously allows for a differential sensing technique using two MTJs per MRAM cell that are compared to each other rather to a reference cell. Therefore size variations between the two MTJs of the cell are minimized and the complete range of sensing signal is available at the sense amplifiers 60 and 66.

To read the data that is stored in cell 12 (MTJ pair made of MTJ 20 and MTJ 21, dummy read word line WL0 40 and read word line WL2 44 are set high, for example to approximately 1.2 Volts. The BL0 50 and BL2 56 are also set high while BL1 52 and BL3 54 are allowed to float (coupled to ground through the current sources 62 and 64, respectively). Each of the foregoing current sources, in an exemplary method and apparatus sources approximately 10 to 30 micro amps. As discussed above, current flows from BL 0 50 through the MTJ 28, dummy read access transistor 30, selected through the foregoing process, MTJ 20, to the current source 62. Current also flows from the BL 2 56 through the MTJ 22, the read access transistor 34, which is also selected, and the MTJ 21 to the current source 64. The voltage at the source of the dummy read access transistor 30 is substantially equal to the voltage of the word line, WL 40, minus Vt (Vt, as readily known to those in the art is the threshold voltage of the transistor 30), and is independent of the resistor value of the MTJ 28. The same holds true for the read access transistor 34, in that the source voltage is independent of the resistance value of the MTJ 22. Thus, the voltage value that appears at the sense amplifier 60 to be the following:

$$V1 = V(\text{word line}) - Vt - 1*R_{MTJ\,20}; \quad \text{Eq. (1)}$$

$$V2 = V(\text{word line}) - Vt - 1*R_{MTJ\,21}; \quad \text{Eq. (2)}$$

Where $R_{MTJ\,20}$ represents the resistance of the MTJ 20 and the $R_{MTJ\,21}$ represents the resistance of the MTJ 21. The differential of V2 versus V1 is utilized for sensing and because it is greater, nearly by two fold, that prior art voltage differentials, it offers greater reliability of read operations.

Depending on the value of the resistance of the MTJ 20 and the MTJ 21, either V1 is greater than V2 or it is less than V2, thereby corresponding to the data stored in the cell 12.

When reading an even cell, BL 1 52 and BL 3 54 are set to '1' or approximately 1.2 volts while the current sources 68 and 70 become active and the current sources 62 and 64 become inactive, which is done based on the polarity of the ODE signal 72. As shown in FIG. 3, when the ODE signal 72 is '0', the current source becomes inactive (or "open"), whereas when the ODE signal 72 is '1', the current source is active. Thus, current flows from BL 1 52 and BL 3 54 through the MTJs similar to that done in the case of an odd cell and through the current sources 68 and 70, and data is coupled at the output of the sense amplifier 66 and output as the read data at the output of the multiplexer 58.

Accordingly, sensing is carried out by sensing two MTJs of a pair of MTJs within a cell thereby foregoing size variation problems encountered by prior art methods and techniques, and allowing for full sensing signal to be available to sense amplifiers, both of which improve reliability of reading and writing operations.

Although the invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method of reading a magnetic memory cell comprising a pair of magnetic tunnel junctions (MTJs) programmed in opposite states by selecting a magnetic memory cell of a magnetic memory array to be read, the magnetic memory cell including a pair of MTJs, an access transistor coupled between a first MTJ of the pair of MTJs and a second MTJ of the pair of MTJs, the method comprising:

turning 'off' a first word line coupled to a first access transistor that is directly coupled to a first MTJ of a pair of MTJs of a magnetic memory cell and to a second MTJ of the pair of MTJs;

turning 'on'' a second and a third word lines, the second word line coupled to a second access transistor and the third word line coupled to a third access transistor;

turning 'on' the second and third access transistors;

depending on whether the magnetic memory cell is 'even' or 'odd', turning 'on' 'even' or 'odd' bit lines and floating the remaining bit lines;

comparing the current flowing through the first MTJ of the pair of MTJs to the current through the second MTJ of the pair of MTJs; and based on the comparison, declaring the state of the magnetic memory cell.

2. The method of reading, as recited in claim 1, wherein if the magnetic memory cell is 'odd', setting the 'even' bit lines 'high' and floating the 'odd' bit lines.

3. The method of reading, as recited in claim 2, wherein if the magnetic memory cell is 'even', setting the 'odd' bit lines 'high' and floating the 'odd' bit lines.

4. The method of reading, as recited in claim 1, wherein if the magnetic memory cell is 'odd', setting the 'even' bit lines 'low' and floating the 'odd' bit lines.

5. The method of reading, as recited in claim 4, wherein if the magnetic memory cell is 'even', setting the 'odd' bit lines 'low' and floating the 'odd' bit lines.

* * * * *